(12) United States Patent
Sato et al.

(10) Patent No.: US 7,173,311 B2
(45) Date of Patent: Feb. 6, 2007

(54) LIGHT-EMITTING SEMICONDUCTOR DEVICE WITH A BUILT-IN OVERVOLTAGE PROTECTOR

(75) Inventors: Junji Sato, Niiza (JP); Koji Otsuka, Niiza (JP); Tetsuji Moku, Niiza (JP); Takashi Kato, Niiza (JP); Arei Niwa, Niiza (JP); Yasuhiro Kamii, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 11/048,954

(22) Filed: Feb. 2, 2005

(65) Prior Publication Data

US 2005/0168899 A1    Aug. 4, 2005

(30) Foreign Application Priority Data

Feb. 2, 2004   (JP)   ............................. 2004-026102
Jul. 26, 2004   (JP)   ............................. 2004-217715

(51) Int. Cl.
*H01L 23/62*   (2006.01)
(52) U.S. Cl. .................. 257/355; 257/81; 257/98; 257/99; 257/100; 257/104; 257/360
(58) Field of Classification Search ................. 257/81, 257/98, 99, 100, 104, 355, 360
See application file for complete search history.

(56) References Cited

U.S. PATENT DOCUMENTS

2002/0179914 A1 * 12/2002 Sheu ........................... 257/90

FOREIGN PATENT DOCUMENTS

| JP | 57093591 | * | 6/1982 |
| JP | 10-135519 | | 5/1998 |
| JP | 10-200159 | | 7/1998 |
| WO | WO-01/22495 | * | 3/2001 |

* cited by examiner

*Primary Examiner*—Leonardo Andujar
*Assistant Examiner*—Tan Tran
(74) *Attorney, Agent, or Firm*—Woodcock Washburn LLP

(57) ABSTRACT

An overvoltage-proof light-emitting diode has a lamination of light-generating semiconductor layers on a first major surface of a silicon substrate. A front electrode in the form of a bonding pad is mounted centrally atop the light-generating semiconductor layers whereas a back electrode covers a second major surface of the substrate. An overvoltage protector, of which several different forms are disclosed, is disposed between the bonding pad and the second major surface of the substrate. The bonding pad and back electrode serves as electrodes for both LED and overvoltage protector. As seen from above the device, or in a direction normal to the first major surface of the substrate, the overvoltage protector lies substantially wholly beneath the bonding pad.

21 Claims, 11 Drawing Sheets

LIGHT-EMITTING SEMICONDUCTOR DEVICE WITH A BUILT-IN OVERVOLTAGE PROTECTOR

CROSS REFERENCE TO RELATED APPLICATIONS

This application claims priority to Japanese Patent Application No. 2004-026102, filed Feb. 2, 2004, and Japanese Patent Application No. 2004-217715, filed Jul. 26, 2004.

BACKGROUND OF THE INVENTION

This invention relates to a light-emitting semiconductor device such as that known as a light-emitting diode in common parlance, and more specifically to such a device fabricated in one piece with an overvoltage protector.

A host of specialists in light-emitting diodes have focused their attention in recent years on nitride semiconductors. The devices built using these materials emit light in the wavelength range of from 365 to 550 nanometers. The nitride semiconductor light-emitting devices have, however, an inherent weakness in withstanding electrostatic breakdown, being susceptible to destruction when subjected to a voltage surge in excess of 100 volts. It might be contemplated to incorporate an overvoltage or surge protector such as a discrete diode or capacitor in one and the same package with the light-emitting device. This remedy is unsatisfactory in consideration of the bulk of the resulting device caused factory in consideration of the bulk of the resulting device caused by the added number of component parts.

More sophisticated solutions are found in Japanese Unexamined Patent Publication Nos. 10-200159 and 10-135519, both suggesting an integration of an overvoltage protector with a light-emitting device. The former teaches a parallel connection of light-emitting device and protector diode on a sapphire substrate. The latter proposes to mount a protector capacitor on top of the light-emitting device on a sapphire substrate, the protector capacitor being also in parallel connection with the light-emitting device.

The suggestions made by these unexamined patent applications are both still objectionable in that the overvoltage protector is positioned to obstruct the emission of light, lessening the effective surface areas of the devices for light emission. This shortcoming may be restated that the devices must be made larger for given output light intensity. As an additional disadvantage, these prior art devices are both unnecessarily complex in construction and difficult of manufacture as they require conductors for electrical connection of the light-emitting device and overvoltage protector.

SUMMARY OF THE INVENTION

The present invention seeks to make an integrated combination of a light-emitting diode and an overvoltage protector simpler in construction, more compact in size, and easier of manufacture, than heretofore without interfering with the efficiency of the light-emitting diode.

Briefly, the invention may be summarized as an overvoltage-proof light-emitting semiconductor device. Included is a substrate of electrically conducting or semiconducting material having a pair of opposite major surfaces, on the first of which there is formed a main semiconductor region including a set of semiconductor layers for generating light. A first electrode comprises a first portion (e.g. transparent or open-worked layer of electrically conducting material) which overlies all or a part of the main semiconductor region and which is pervious to the light generated thereby, and a second portion electrically connected to the first portion of the first electrode and having a function of a bonding pad. A second electrode is formed on the second major surface, or in some other convenient position on, the substrate and electrically connected thereto. An overvoltage protector is disposed between the second portion of the first electrode and the second major surface of the substrate and electrically connected to both of the first and the second electrode.

The overvoltage protector may be disposed either inside the substrate or between the first major surface of the substrate and the bonding pad. In practice the overvoltage protector may take a variety of forms such as a Schottky barrier diode, a diode having one or two pn junctions, a capacitor, and a varistor. Two or more such devices may also be adopted in combination. Embodiments employing all such overvoltage protectors will be disclosed.

The overvoltage-proof light-emitting semiconductor device according to the invention is perhaps best characterized by the fact that the overvoltage protector at least partly, preferably wholly, underlies the bonding pad. So positioned, the overvoltage protector does not lessen the light-emitting surface of the device.

The bonding pad serves not only as an electrode of the light emitting device, as well as for its electrical connection to external equipment, but also for electrical interconnection of the light-emitting device and overvoltage protector. The overvoltage-proof light-emitting device as a whole is therefore simpler and less expensive in construction, smaller in size, and easier of manufacture than the prior art set forth above.

The light-emitting device and overvoltage protector can be additionally electrically interconnected via the substrate by fabricating the latter from an electroconductive material. For this reason, too, the device can be made simpler and less expensive in construction, smaller in size, and easier of manufacture.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
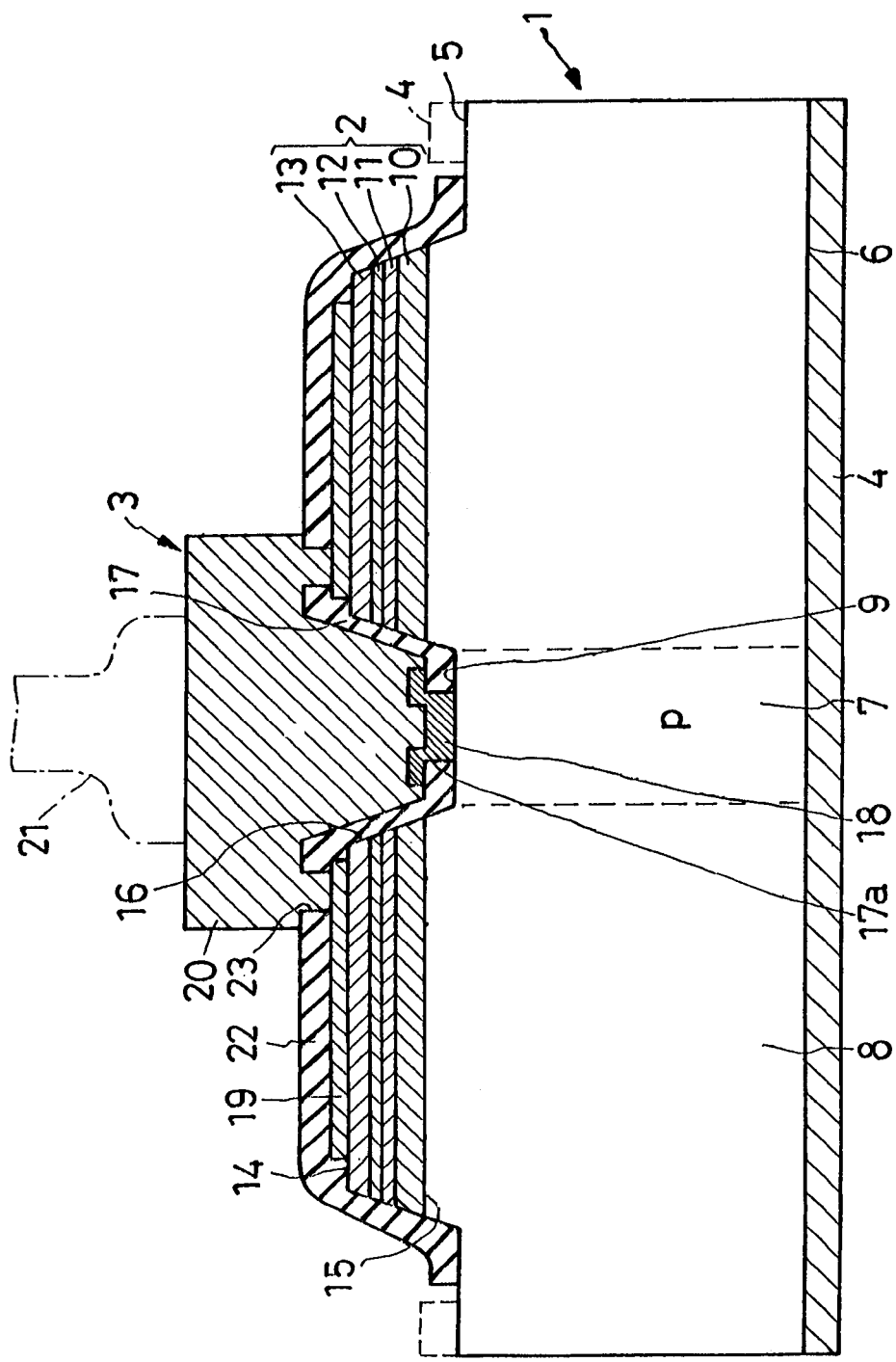
FIG. 1 is a schematic cross section through a preferred form of overvoltage-proof light-emitting diode embodying the principles of this invention.
Figure 2:
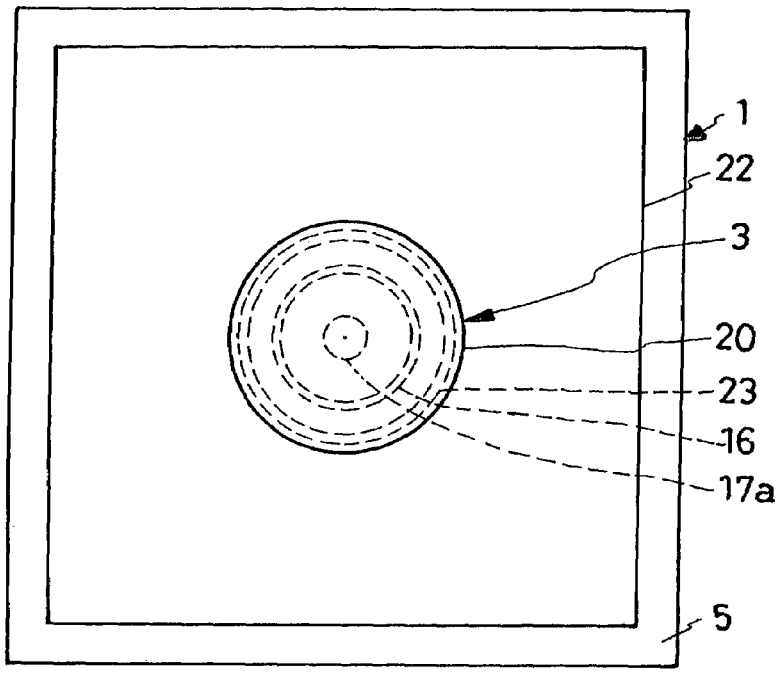
FIG. 2 is a top or front plan, drawn on a somewhat reduced scale, of the overvoltage-proof light emitting diode of FIG. 1.

The present invention is believed to be best embodied in the composite semiconductor device of FIGS. 1 and 2 integrally comprising a light-emitting diode (LED) and an overvoltage protector in the form of a Schottkey barrier diode. This overvoltage-proof LED, so it might be called, has a semiconductor substrate 1 on which there is formed a main semiconductor region 2 of annular shape in the form of a lamination of several constituent layers for provision of an LED. A front electrode 3 as the first electrode is a combination of a transparent film 19 as the first portion of electrically conducting material overlying the main semiconductor region 2, and a bonding pad 20 as the second portion mounted centrally atop, and partly received in the central opening in, the main semiconductor region 2. The transparent conducting film 19 and bonding pad 20 are directly electrically connected to each other. A back electrode 4 as the second electrode on the other hand covers the complete underside of the substrate 1.

The substrate 1 is of p-type monocrystalline silicon doped with a conductivity-type determinant such as boron or other Group III elements of the Periodic Table. Formed to include a pair of opposite major surfaces 5 and 6, the substrate 1 has a protector region 7 extending approximately centrally therethrough between these major surfaces for creation of the overvoltage protector yet to be detailed. The main semiconductor region 2 overlies the major surface 5 of the substrate 1, which is just (111) in terms of Miller indices.

The substrate 1 has a p-type impurity concentration ranging from $5 \times 10^{18}$ to $5 \times 10^{19}$ cm$^{-3}$, and a resistivity ranging from 0.0001 to 0.0100 ohm-centimeters, so that this substrate may be described as electrically conductive, providing current paths for both LED and overvoltage protector. More specifically, the protector region 7 of the substrate 1 provides not just the main working part of the Schottkey barrier diode but a current path therefor as well. The rest 8 of the substrate 1, encircling the protector region 7 serves as a current path for the LED. Additionally, of course, the substrate 1 serves the purposes of letting the layers of the main semiconductor region 2 of the LED to be grown epitaxially thereon, and mechanically supporting this region 2 and the electrodes. In order for the substrate to fully perform all these functions, it may be made as thick as from 200 to 500 micrometers.

Figure 3:
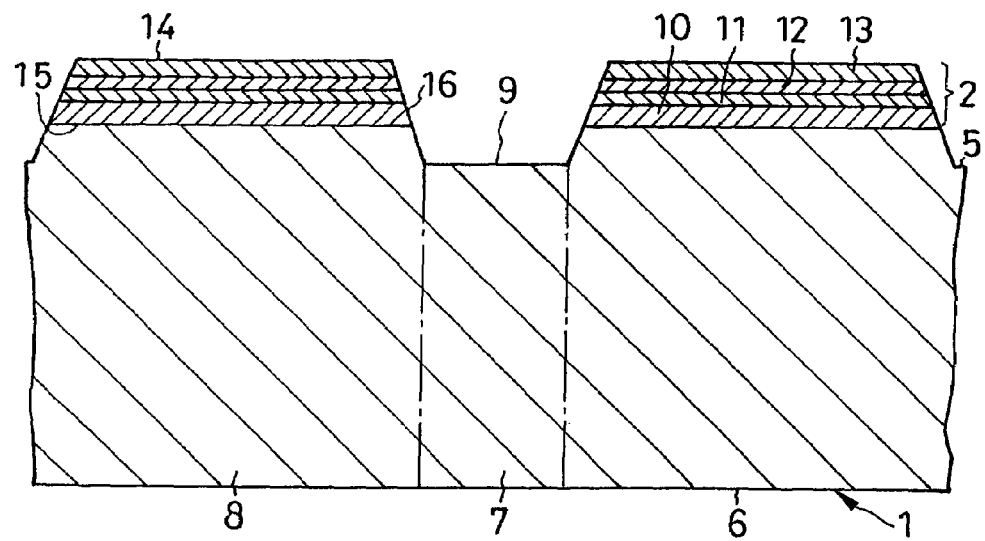
FIG. 3 is an enlarged cross sectional view showing part of the substrate of the FIG. 1 device together with the main semiconductor region thereon.

As will be observed from FIG. 1, as well as from FIG. 3 which shows only part of the substrate 1 together with the main semiconductor region 2 thereon, the substrate has a central depression 9 and annular peripheral depression formed in its major surface 5. These depressions are not an absolute requirement; instead, the entire major surface 5 of the substrate 1 could be flat. Further the substrate 1 could be of n-type conductivity. Still further the outer region 8 of the substrate 1 could be made higher in impurity concentration than its protector region 7, thereby making the outer region less in resistivity than the protector region and so lessening a voltage drop in the outer region during the operation of the LED.

With reference to both FIGS. 1 and 3 the main semiconductor region 2 is made up of layers of the compounds of the Groups III–V elements different from that of the substrate 1. Successively grown in vapor phase on the substrate 1, the component layers of the main semiconductor region 2 include an n-type buffer layer 10, n-type semiconductor layer 11, active layer 12, and p-type semiconductor 13, constituting in combination a double heterojunction LED in this particular embodiment. The semiconductor layers 11 and 13 of opposite conductivity types on the opposite sides of the active layer 12 are also referred to as claddings or confining layers.

At least in principle the main semiconductor region 2 of an LED can consist of the n-type semiconductor layer 11 and p-type semiconductor layer 13, so that the illustrated configuration of the main semiconductor region is modifiable in more ways than one. Either or both of the buffer layer 10 and active layer 12 are omissible. As required or desired, moreover, a current spreading layer, ohmic contact layer, or like known LED components may be added to the main semiconductor region 2. The main semiconductor region 2 has a pair of opposite major surfaces 14 and 15 extending parallel to each other and to the major surfaces 5 and 6 of the substrate 1. It is the major surface 14 of the main semiconductor region 2 from which emerges the light generated in the active layer 12. The other major surface 15 of the main semiconductor region 2 directly adjoins the major surface 15 of the substrate 1, coupled thereto both mechanically and electrically.

The buffer layer 10 of the main semiconductor region 2 is shown as a single layer in FIG. 1 for the sake of simplicity only. Actually, the buffer layer 10 is a lamination of first and second nitride semiconductor sublayers of slightly different compositions arranged alternately a required number of times.

The first sublayers of the buffer layer 10, including the one constituting the bottom of the buffer sublayer, are preferably made from, in addition to a dopant, any of the aluminum-containing nitrides that are generally expressed by the formula:

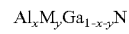

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one. Specific examples meeting this formula are aluminum nitride (AlN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN). The first buffer sublayers should be closer in both lattice constant and thermal expansion coefficient to the silicon substrate 1 than are the second buffer sublayers of a composition detailed below.

Intended to enhance the buffering action of the buffer layer 10, the second buffer sublayers are made from any of the n-type nitride semiconductors that does not contain aluminum or that does contain aluminum in a proportion less than the aluminum proportion of the first buffer sublayers. Such nitride semiconductors are generally expressed by the formula:

$$Al_a M_b Ga_{1-a-b} N$$

where M is at least either of indium and boron; the subscript a is a numeral that is equal to or greater than zero and less than one and, additionally, less than x in the formula above defining the materials for the first buffer sublayers; the subscript b is a numeral that is equal to or greater than zero and less than one; and the sum of a and b is equal to or less than one. Thus the second buffer sublayers $2_b$ can be made from any of GaN, AlInN, AlGaN, AlInGaN, AlBN, AlBGaN, and AlBInGaN, plus an n-type dopant. The second buffer sublayers $2_b$ are each greater in thickness than each first buffer sublayer $2_a$. Preferably, in order to keep the second buffer sublayers from cracking, their aluminum content should be such that a in the formula above is less than 0.2.

The first sublayers of the buffer layer 10 are each from 0.5 to 5.0 nanometers thick. The three overlying main semiconductor layers 11–13 would not all gain a desired degree of flatness if the first buffer sublayers were each less than 0.5 nanometer thick. Should they each exceed 5.0 nanometers in thickness, on the other hand, then the quantum-mechanical tunnel effect would not be obtained.

The second sublayers of the buffer layer 10 are each from 0.5 to 200.0 nanometers thick. Again the three overlying main semiconductor layers 11–13 would be flat enough should each second buffer sublayer be less than 0.5 nanometer thick. The buffer layer 10 might develop cracks if each second buffer sublayer were more than 200 nanometers thick.

Although the n-type buffer layer 10 contacts the p-type silicon substrate 1, little voltage drop will occur across the junction between substrate and buffer layer upon application of a forward bias voltage because they make a heterojunction and, additionally, because an alloyed region is created therebetween. Alternatively, an n-type silicon substrate may be employed in lieu of the p-type silicon substrate, and the n-type buffer layer may be formed thereon. The division of the buffer layer into several sublayers is not an essential feature of the invention either.

Overlying the buffer layer 10, the n-type semiconductor layer 11 is made from any of the nitride semiconductors that are generally expressed as:

$$Al_a M_b Ga_{1-a-b} N$$

where M is at least either of indium and boron; the subscript a is a numeral that is equal to or greater than zero, equal to or less than one, and less than x; the subscript b is a numeral that is equal to or greater than zero and less than one; and the sum of a and b is equal to or less than one. GaN or other n-type compounds based thereon are particularly desirable.

The active layer 12 on the n-type semiconductor layer 11 is made from any of nitride semiconductors that are generally expressed as:

$$Al_x In_y Ga_{1-x-y} N$$

where the subscript x is a numeral that is equal to or greater than zero and less than one, and the subscript y is a numeral that is equal to or greater than zero and less than one. Despite the showing of FIG. 1, the active layer 12 is actually of multiquantum well design, including a plurality or multiplicity of barrier sublayers and well sublayers. These sublayers are not shown because the division of the active layer into such sublayers is not an essential feature of the invention. It is also understood that the active layer 12 is not doped with an impurity in this embodiment of the invention, although either p- or n-type impurity may be added as required or desired.

The p-type semiconductor layer 13 on the active layer 12 is made from, in addition to a p-type dopant, any of the nitride semiconductors that are generally defined as $$Al_x In_y Ga_{1-x-y} N$$

where the subscript x is a numeral that is equal to or greater than zero and less than one, and the subscript y is a numeral that is equal to or greater than zero and less than one. The p-type semiconductor layer 13 is of p-type GaN, and 500 nanometers thick, in this embodiment of the invention.

The main semiconductor region 2 has a hole 16 extending centrally therethrough across its opposite major surfaces 14 and 15 and joined directly to the depression 9 in the substrate 1 in axial alignment therewith. The depression 9 and hole 16 are created at one time by etching the article of FIG. 3, which is obtained by epitaxially growing the main semiconductor region 2 on the substrate 1. Thus the silicon of the substrate 1 is exposed at the surfaces defining the depression 9, the alloy layer between substrate 1 and main semiconductor region 2 having been removed by the etching. Having been etched, the depression 9 and hole 16 generally taper as they extend from main semiconductor region 2 to substrate 1. The depression 9 is aligned with the protector region 7 of the substrate 1. It will also be noted from FIG. 1 that a film 17 of electrically insulating material covers the surfaces defining the depression 9 and hole 16.

Generally designated by the numeral 3, the front electrode comprises as aforesaid the transparent conductive film 19 and bonding pad 20, both of course of electrically conducting material. The bonding pad 20 is disposed approximately centrally on the transparent conductive film 19. Also, the bonding pad 20 makes direct contact with both transparent conductive film 19 and Schottky contact metal region 18, thus serving for interconnection of these parts 18 and 19 as well as for connection to external circuitry.

The transparent conductive film 19 is intended for uniform current flow through the entire main semiconductor region 2. It is practically impossible, however, for the film 19 to gain 100-percent transparency for unimpeded passage therethrough of the light generated in the main semiconductor region 2. Some percentage of the light will inevitably be blocked. A highly transparent film would also add substantively to the manufacturing cost of the LED. Actually, the omission of this film 19 will incur no serious inconvenience in both construction and operation of the LED. Whether to employ the film 19 or not may therefore be determined in consideration of such factors as the efficiency of light emission and the costs of manufacture.

The bonding pad 20 will make direct ohmic contact with the major surface 14 of the main semiconductor region 2 in the case where the transparent conductive film 19 is not employed. With the bonding pad 20 thus placed in direct ohmic contact with the main semiconductor region major surface 14, current will flow from front electrode 3 to main semiconductor region 2. Also, in the absence of the transparent conductive film 19, the bottom periphery of the bonding pad 20 will perform the function of that film or the first portion of the first electrode.

In this particular embodiment, however, the transparent conductive film 19 is shown covering nearly all the major surface 14 of the main semiconductor region 2, or of its p-type semiconductor layer 13, for uniform current flow therethrough with a minimum of light absorption. The transparent conductive film 19 is made from a mixture of indium oxide and tin oxide to a thickness of 100 nanometers or so in this embodiment. Speaking more broadly, however, the transparent conductive film 19 may be made from any one, or an alloy of any two or more, of metals such as nickel (Ni), platinum (Pt), palladium (Pd), rhodium (Rh), ruthenium (Ru), osmium (Os), iridium (Ir), and gold (Au).

Made from titanium (Ti), Pt, chromium (Cr), aluminum (Al), samarium (Sm), PtSi, or $Pd_2Si$, the Schottky metal region 18 is formed to include a portion extending through a hole $17_a$ in the insulating film 17. The hole $17_a$ exposes the surface of the silicon substrate 1, or of its protector region 7, forming the bottom of the depression 9 in the substrate, so that the Schottky metal region 18 makes Schottky contact with the exposed surface of the protector region 7 of the substrate. The protector region 7 and metal region 18 constitute in combination a Schottky diode by way of a overvoltage protector.

As seen in a plan view as in FIG. 2, the bonding pad 20 is conveniently less in size than the main semiconductor region 2. Although the main semiconductor region 2 does not appear in FIG. 2, its size is apparent from that of a shield 22 of transparent, electrically insulating material which, as shown in both FIGS. 1 and 2, covers the complete transparent conductive film 14 as well as the exposed peripheral parts and edges of the main semiconductor region 2. Made from a metal that permits the bonding of connecting wire 21 of aluminum or gold, the bonding pad 20 is electrically connected to both Schottky metal region 18 and transparent conductive film 19. More specifically, the bonding pad 20 extends through a hole 23 in the shield 22 into contact with the transparent conductive film 19 and further with the Schottky metal region 18 in the hole 16 in the main semiconductor region 2.

Speaking broadly, again as seen in a plan view as in FIG. 2, the bonding pad 20 should be in register with at least part of the protector region 7 of the substrate 1 and out of register with at least part of the main semiconductor region 2. Further the bonding pad 20 should electrically interconnect the Schottky metal region 18 and transparent conductive film 19. In FIG. 1 the bonding pad 20 is shown to have a portion that is substantially greater in diameter than the hole 16 in the main semiconductor region 2. Totally exposed and left uncovered by the shield 22, this larger part of the bonding pad 20 permits the connecting wire 21 to be easily bonded thereto. The surface of the main semiconductor region 2 defining the hole 16 is electrically separated from the front electrode 3 by the insulating film 17.

The bonding pad 20 must not be too large as it must be thick enough (e.g. from 100 nanometers to 100 micrometers) to permit the bonding of the connecting wire 21 and so is impervious to light. Even if the bonding pad is so made as to be somewhat transparent, little or no light will travel therethrough after the joining of the wire 21 thereto. The cylindrical shape of the bonding pad pictured in FIG. 2 is by way of example only; in practice, it may be of polygonal or other shape. The insulating film 17, formed in the hole 16 in the main semiconductor region 2 in order to insulate this region from the bonding pad 20, is capable of fabrication concurrently with the shield 22 covering most of the main semiconductor region 2.

Once again as seen in a plan view as in FIG. 2, the protector region 7 of the substrate 1 lies wholly inside of the bonding pad 20. The overvoltage protector would function properly if the protector region 7 were so large as to protrude from under the bonding pad 20. Such a large protector region would correspondingly reduce that part of the substrate 1 which must be reserved for the LED. It is therefore recommended that, as seen in a plan view, 70 percent or more, preferably 100 percent, of the protector region should lie inwardly of the bonding pad 20.

The back electrode 4, FIG. 1, is a layer of metal covering the complete major surface 6 of the substrate 1 and so making ohmic contact with both its protector region 7 and outer region 8. Alternatively, as indicated by the broken lines in FIG. 1, this electrode 4 could be disposed on the periphery of the other major surface 5 of the substrate 1.

Figure 4:
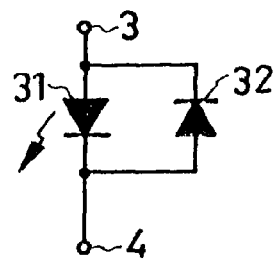
FIG. 4 is a schematic electrical diagram of the FIG. 1 device.

The bonding pad 20 of the front electrode 3 serves the purpose of connecting the metal region 18 of the Schottky barrier diode to the LED, in addition to that of connecting the LED to external circuitry. The back electrode 4 on the other hand functions as electrode for both LED and Schottky barrier diode. As a consequence, as indicated diagrammatically in FIG. 4, the composite semiconductor device of FIG. 1 represents a circuit of an LED 31 and Schottky barrier diode 32 connected reversely in parallel with each other. Conducting upon application of a reverse voltage surge in excess of a predetermined value to the LED 31, the Schottky barrier diode 32 protects the LED from the reverse overvoltage due for example to static electricity. The voltage that triggers conduction through the Schottky barrier diode is set less than the maximum permissible reverse voltage of the LED 31.

The overvoltage-proof LED of FIG. 1 gains the following advantages:

1. The protector region 7 underlies the bonding pad 20 of the front electrode 3, in no way lessening the effective surface area of the LED for light emission. LEDs of this type may also be made less in size than heretofore for a given light emission surface area.

2. Both bonding bad 20 and back electrode 4 serve not only for interconnection of the LED 31 and Schottky barrier diode 32 but as conductors for connection to external circuitry, contributing to the simpler construction, smaller size, and lower manufacturing cost of the overvoltage-proof LED.

3. The overvoltage protector is easily and inexpensively fabricated as the protector region 7 lies wholly within the substrate 1.

Figure 5:
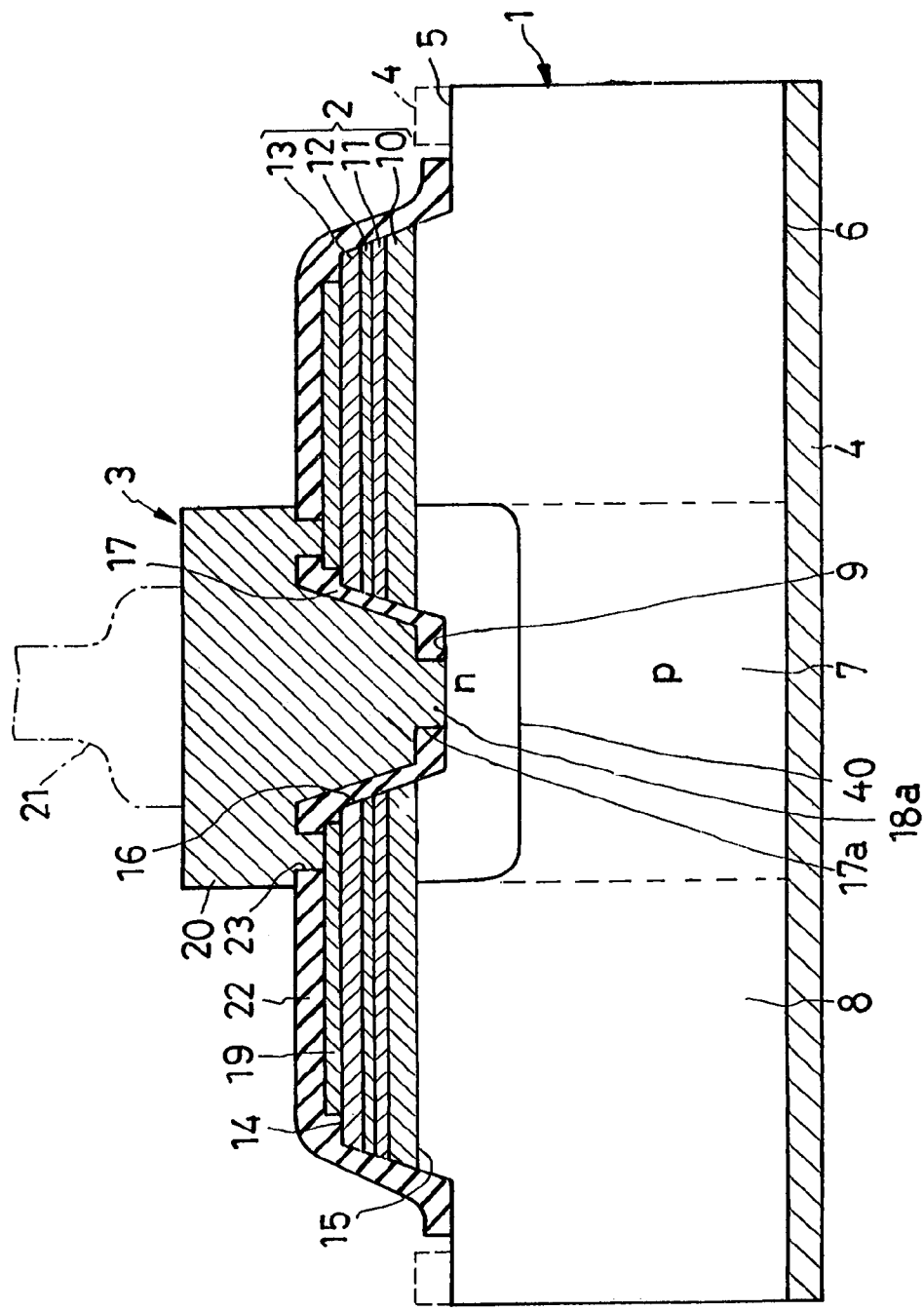
FIG. 5 is a view similar to FIG. 1 but showing another preferred form of overvoltage-proof light-emitting diode according to the invention.

Embodiment of FIG. 5

Another preferred form of overvoltage-proof LED shown in FIG. 5 features a pn-junction diode employed as an overvoltage protector in lieu of the Schottky barrier diode of the preceding embodiment. An n-type semiconductor region 40 is formed in part of the protector region 7 of the silicon semiconductor substrate 1 in order to provide the pn-junction diode. This embodiment also differs from that of FIGS. 1–4 in having no metal region 18 seen in FIG. 1.

The pn-junction protector diode is comprised of the noted n-type semiconductor region 40 which is formed island-like in the protector region 7 of the substrate 1 so as to be exposed at the major surface 5 of the substrate, and the remaining p-type part of the substrate. The n-type region 40 is formed by diffusing an n-type impurity into part of the preformed p-type substrate 1. It will be seen that the n-type region 40 is exposed at the bottom of the depression 9 formed in the surface of the protector region 7. The bonding pad 20 has its lowermost part $18_a$ held in ohmic contact with the n-type region 40. Optionally, a metal layer may be interposed between bonding pad 20 and n-type region 40 for better ohmic contact. As seen from above the device of FIG. 5, the n-type region 40 wholly lies inwardly of the bonding pad 20.

Both front electrode 3 and back electrode 4 function as such for both LED and pn-junction diode. The composite semiconductor device of FIG. 5 may therefore be electrically diagramed as in FIG. 6, in which the LED 31 and pn-junction diode $32_a$ are connected reversely in parallel with each other between the electrodes 3 and 4. The pn-junction diode $32_a$ may be constructed as either a rectifying or a voltage-regulating diode. Conducting upon application of a reverse voltage in excess of a predefined limit to the LED 31, the pn-junction diode $32_a$ protects the LED from destruction. The conduction voltage of the pn-junction diode $32_a$ must be less than the maximum allowable reverse voltage of the LED 31.

When constructed as a constant-voltage diode or a voltage-regulating diode such as a zener diode, the pn-junction diode $32_a$ may have its reverse breakdown voltage determined intermediate the normal forward voltage and maximum allowable forward voltage of the LED 31. The constant-voltage pn-junction diode $32_a$ will then effectively protect the LED 31 from forward voltage surges or like overvoltage.

It is self-evident that this overvoltage-proof LED gains the same advantages as that of FIG. 1, the only difference of the former from the latter being that the pn-junction diode is employed in place of the Schottky barrier diode. As desired, part of the outer region 8 of the substrate 1 of the LED may be made higher in impurity concentration, and therefore less in resistivity, than its protector region 7. Less voltage drop will then occur in the outer region 8 during the operation of the LED.

Figure 7:
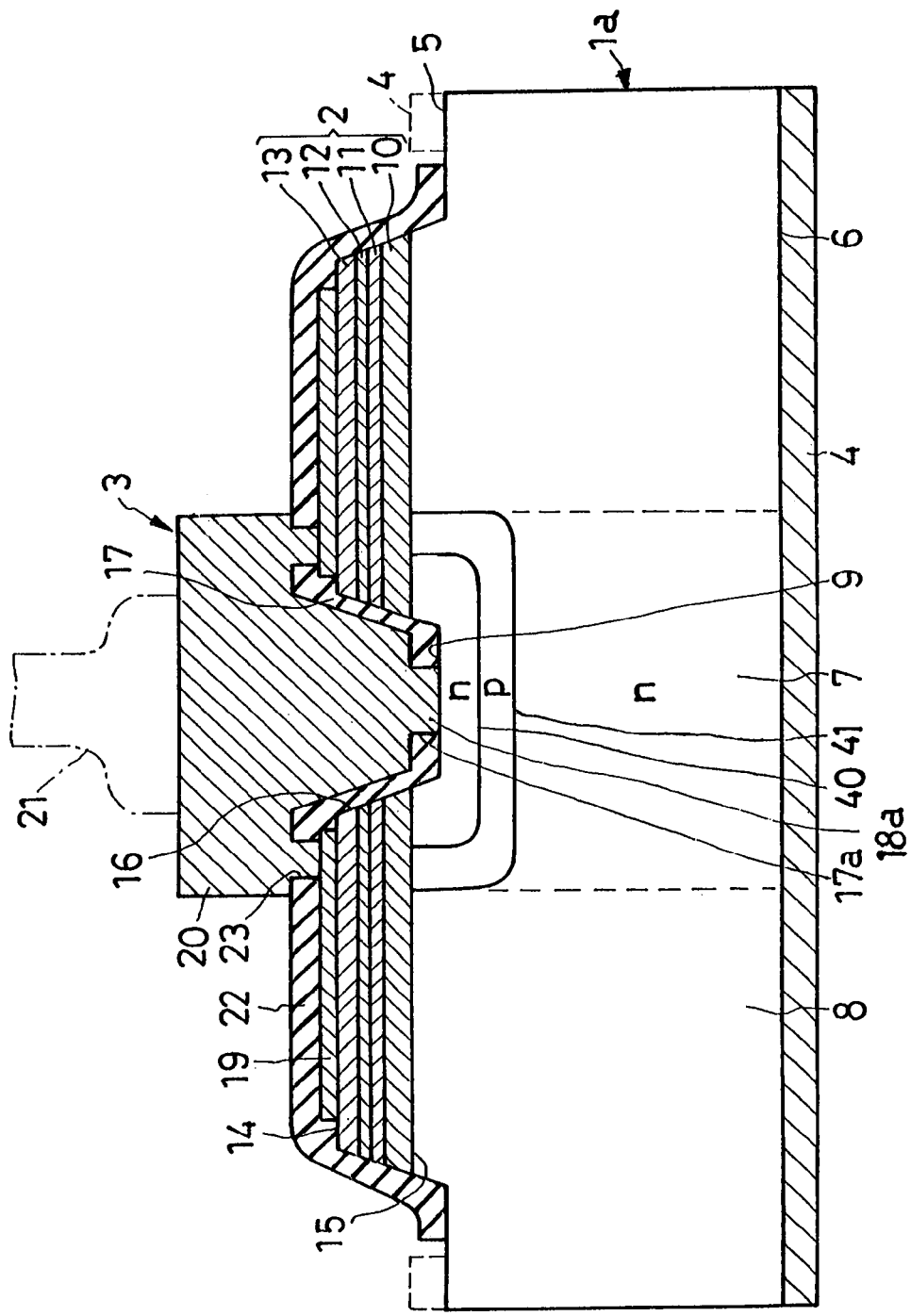
FIG. 7 is a view similar to FIG. 1 but showing still another preferred form of overvoltage-proof light-emitting diode according to the invention.

Embodiment of FIG. 7

Shown in FIG. 7 is still another preferred form of overvoltage-proof LED according to the invention, in which the overvoltage protector takes the form of a three-layer diode. The FIG. 7 device employs an n-type silicon substrate $1_a$ instead of the p-type silicon substrate 1 of the FIG. 1 device. The protector region 7 of the n-type substrate $1_a$ has formed therein an n-type semiconductor region 40 and, under and around this region 40, a p-type semiconductor region 41. These regions 40 and 41 constitute in combination with the rest of the protector region 7 an npn three-layer diode which is a bidirectional diode known as a diac. The FIG. 7 device is similar to that of FIG. 1 in all the other details of construction except for the absence of the metal region 18.

Thus, in the FIG. 7 embodiment, the overvoltage protector takes the form of the three-layer diode formed in the protector region 7 of the substrate $1_a$. The three-layer diode is comprised of the n-type silicon substrate $1_a$, the p-type semiconductor region 41 which is formed island-like in the substrate $1_a$ and which has a surface exposed at the major surface 5 of the substrate, and the n-type semiconductor region 40 which is formed island-like in the p-type semiconductor region 41 and which has a surface exposed at the major surface 5 of the substrate.

The n-type semiconductor region 40 of the FIG. 7 device is made less in size than that of FIG. 5, and the p-type semiconductor region 41 surrounds all but the exposed top of the region 40. Created by diffusion of a p-type impurity in the n-type substrate 1, the p-type semiconductor region 41 forms a pn junction at its interface with the substrate. The n-type semiconductor region 40 has its top partly exposed at the bottom of the depression 9 in the protector region 7 of the substrate 1, so that the bonding pad 20 of the front electrode 3 has its bottommost part $18_a$ in ohmic contact with the n-type semiconductor region 40. A metal layer could be interposed between these parts 20 and 40 for better ohmic contact. Although larger in external size than the n-type semiconductor region 40, the p-type semiconductor region 40 lies inwardly of the bonding pad 20 as seen in a direction normal to the major surfaces 5 and 6 of the substrate 1.

Figure 8:
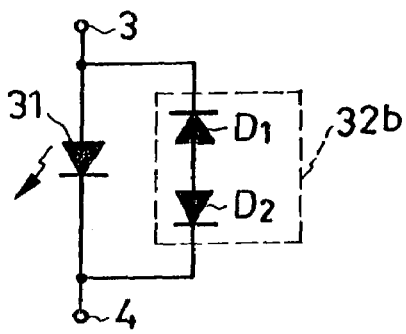
FIG. 8 is a schematic electrical diagram of the FIG. 7 device.

The electrodes 3 and 4 function as such for both LED and npn diode. Electrically, therefore, the overvoltage-proof LED of FIG. 7 is configured as diagramed in FIG. 8, in which the LED 31 and npn diode $32_b$ are shown connected in parallel with each other between the electrodes 3 and 4. The npn diode $32_b$ is functionally equivalent to the serial connection of reverse diode $D_1$ and forward diode $D_2$, although it may also be indicated as a reversely parallel connection of the diodes $D_1$ and $D_2$. The npn diode $32_b$ will effectively protect the LED 31 from overvoltages such as a surge higher than the maximum allowable voltage of the LED by having its forward and reverse breakdown voltages both set between the normal and maximum allowable voltages of the LED.

Figure 9:
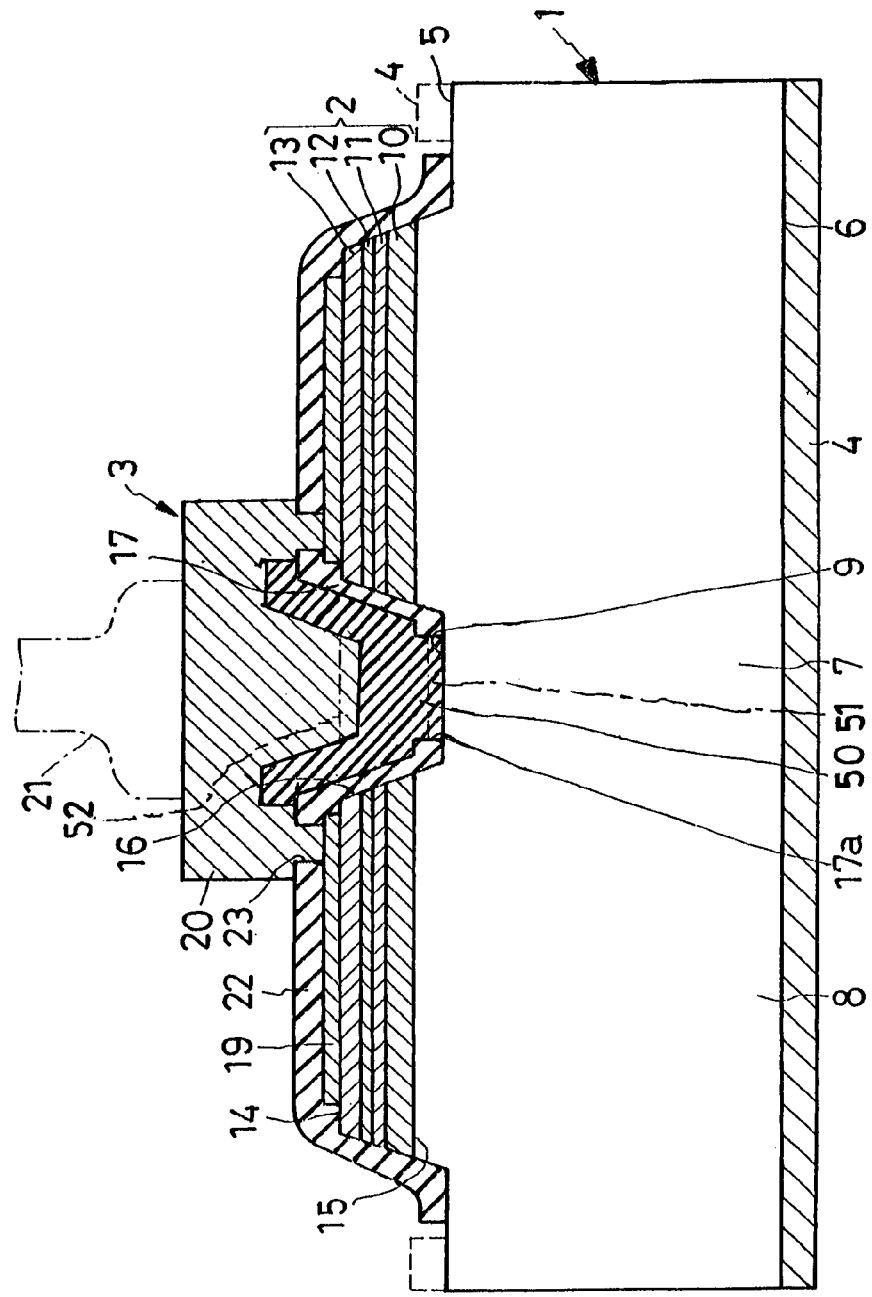
FIG. 9 is a view similar to FIG. 1 but showing yet another preferred form of overvoltage-proof light-emitting diode according to the invention.

Embodiment of FIG. 9

A further preferred form of overvoltage-proof LED in FIG. 9 employs a capacitor for overvoltage protection, all the other details of construction being as set forth above with reference to FIGS. 1–3. For providing the capacitor the a dielectric region 50 is formed in the hole 16 in the main semiconductor region 2. The dielectric region 50 is of a dielectric ceramic material having a specific dielectric constant (e.g. 1200–2000) that is higher than that of silicon dioxide from which is made the insulating film 17 insulating the dielectric region from the main semiconductor region 2.

More specifically, the dielectric ceramic material employed for the dielectric region 50 in this embodiment of the invention is a combination of a primary ingredient in the form of an oxide of Groups II and IV metals, and an additive or additives in the form of an oxide or oxides of Group III or V metals. Typically, the primary ingredient may be either barium titanate ($BaTiO_3$) or strontium titanate ($SrTiO_3$). The additive or additives may be one or more of Group III metal oxides such as neodymium oxide ($Nd_2O_3$), lanthanum oxide or lanthana ($La_2O_3$), $Da_2O_3$, samarium oxide ($Sm_2O_3$), praseodymium oxide ($Pr_2O_3$), gadolinium oxide ($Gd_2O_3$), and holmium oxide ($Ho_2O_3$), and/or one or more of Group V metal oxides such as niobium oxide ($Nb_2O_5$) and tantalum oxide ($Ta_2O_5$).

Two methods are possible for creation of the dielectric region 50. One is to paste the selected dielectric ceramic material with an organic binder, to coat the paste in the required position during the fabrication of the FIG. 9 device, and to bake the coating. The other method is to attach a so-called green sheet of the dielectric ceramic material to the required position and to bake the attached sheet.

A closer study of FIG. 9 will reveal that the dielectric region 50 is in direct contact with the silicon substrate 1 on one hand and with the bonding pad 20 of the front electrode 3 on the other. Thus the substrate 1, dielectric region 50 and bonding pad 20 constitute in combination the required capacitor for overvoltage protection.

Figure 10:
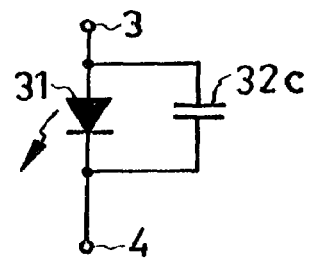
FIG. 10 is a schematic electrical diagram of the FIG. 9 device.

As equivalently diagramed in FIG. 10, the FIG. 9 device embodies a parallel connection of the LED 31 and the protector capacitor $32_c$. The protector capacitor $32_c$ protects the LED 31 from a voltage surge or the like that is higher than its normal operating voltages.

It will be appreciated that the dielectric region 50 of the protector capacitor $32_c$ lies between bonding pad 20 and substrate 1 and wholly inwardly of the bonding pad as seen from above the device. Thus the protector capacitor $32_c$ protects the LED 31 without diminishing the effective surface area of the LED for light emission. It is also noteworthy that, being disposed in the hole 16 in the main semiconductor region 2 of the LED, the dielectric region 50 does not substantially add to the thickness of the device.

As indicated by the broken lines in FIG. 9, a pair of capacitor electrodes 51 and 52 could be provided on the opposite sides of the dielectric region 50. The dielectric region 50 itself could be replaced by a capacitor chip.

Figure 11:
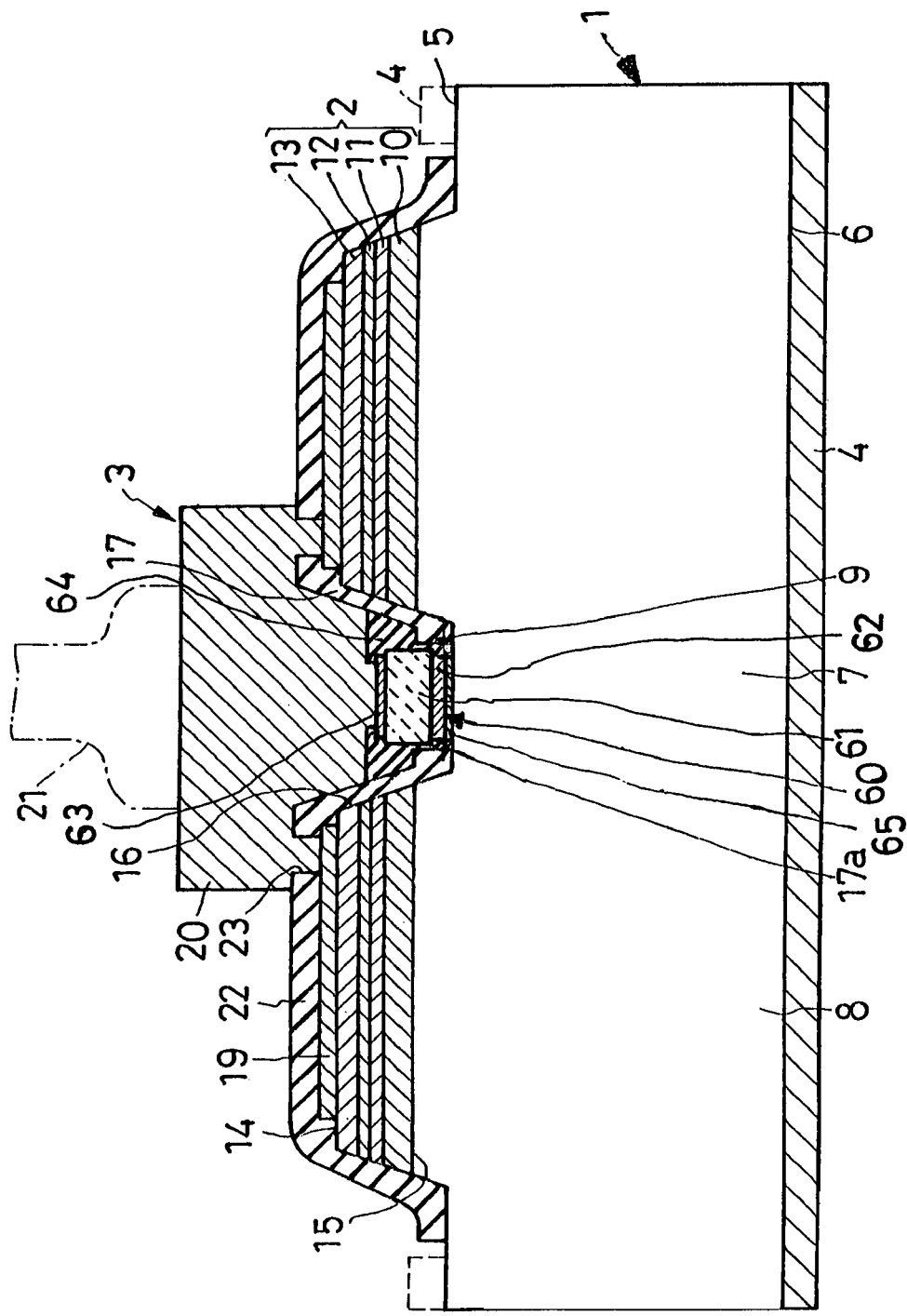
FIG. 11 is a view similar to FIG. 1 but showing a further preferred form of overvoltage-proof light-emitting diode according to the invention.

Embodiment of FIG. 11

This device employs a varistor 60 in chip form in place of the Schottky metal region 18, FIG. 1 or the dielectric layer 50, FIG. 9. The varistor chip is comprised of a ceramic semiconductor region 61 and a pair of electrodes 62 and 63 on opposite sides of the ceramic region. An insulator 64 is shown inserted in FIG. 11 between bonding pad 20 and electrode 62 for electrically insulating them from each other.

The ceramic region 61 may consist essentially of a major ingredient such as $BaTiO_3$, $SrTiO_3$ and zinc oxide (ZnO), and an additive or additives such as $Nb_2O_5$ and $Pr_6O_{11}$. The varistor electrode 62 is bonded via a layer of an electrically conducting adhesive, not shown, to an ohmic electrode 65 on the major surface 5 of the substrate 1. The other varistor electrode 63 makes direct contact with the bonding pad 20. The varistor 60 has a varistor voltage of 10 volts or so.

Figure 12:
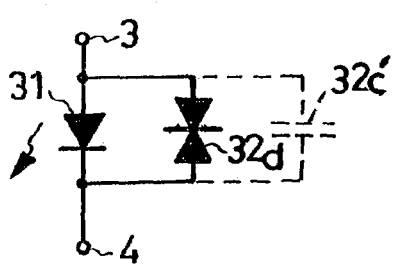
FIG. 12 is a schematic electrical diagram of the FIG. 11 device.

As indicated by its equivalent electrical diagram of FIG. 12, the FIG. 11 device represents a parallel connection of the LED 31 and the protector varistor $32_d$, the latter being an electrical equivalent to the varistor chip 60. Functionally, the varistor $32_d$ is equivalent to a bidirectional diode similar to the three-layer diode of FIG. 8. The varistor voltage should preferably be intermediate the normal forward and reverse operating voltages and maximum allowable voltage of the LED 31.

The ceramic region 61 is also a dielectric, additionally providing a capacitor indicated by the broken lines in FIG. 12 and therein labeled $32_c'$. Connected in parallel with the LED 31, this capacitor $32_c'$ coacts with the varistor $32_d$ to render the LED still more immune to overvoltages.

In this embodiment, too, the protector varistor chip 60 is compactly installed between substrate 1 and bonding pad 20. Overvoltage protection of the LED is therefore accomplished without substantially adding to its size or cost of manufacture.

As will readily occur to the specialists, the varistor chip 60 is replaceable by a region of electrical resistor having voltage nonlinearity, that is, a ceramic semiconductor region having a varistor characteristic. Such a ceramic semiconductor region may be formed by coating the paste of the required material as in the fabrication of the dielectric region 50, FIG. 9, and by baking the coating. The ceramic semiconductor region may be placed in contact with the bonding pad 20 on one hand and with the major surface of the substrate 1 on the other.

Figure 13:
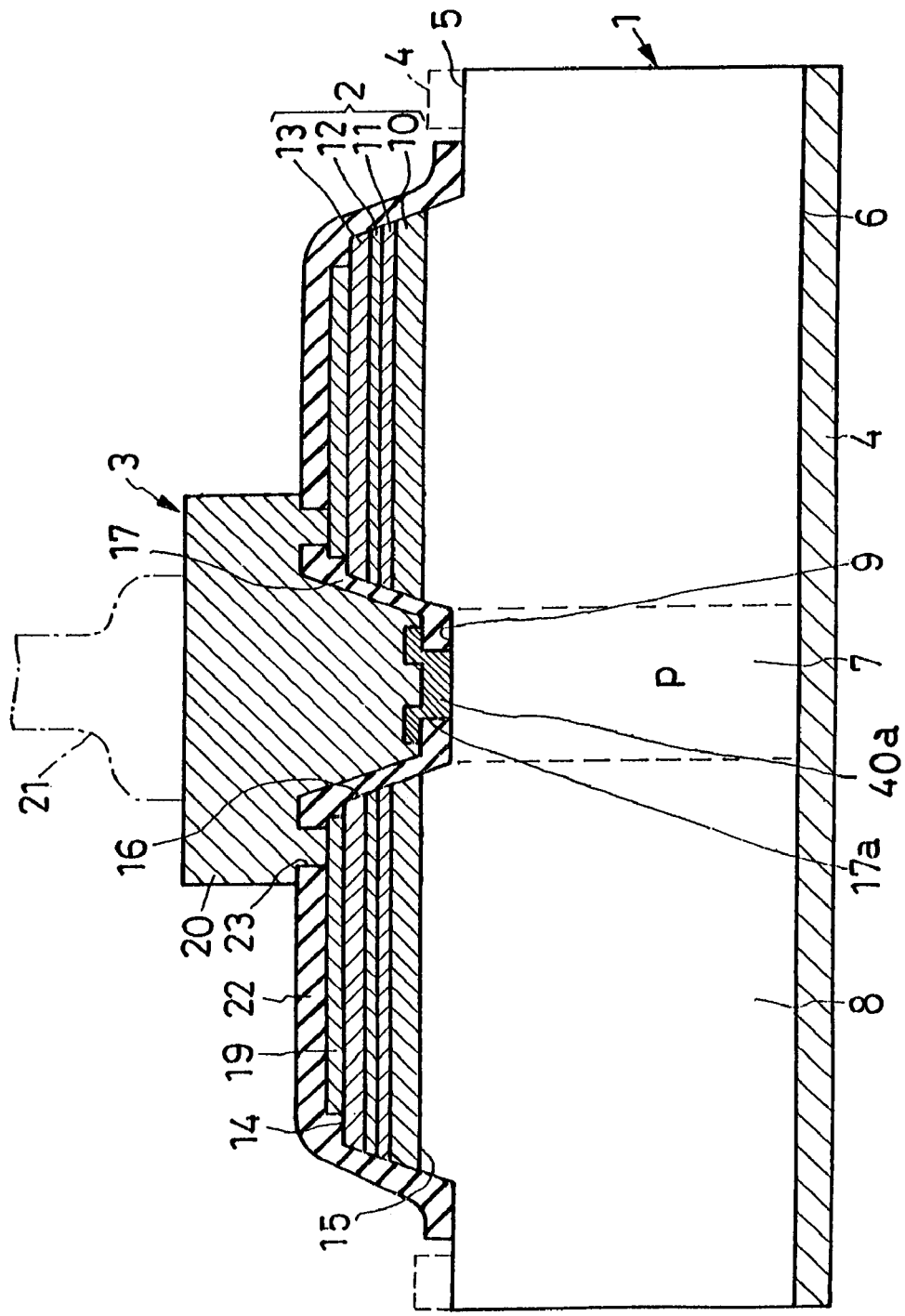
FIG. 13 is a view similar to FIG. 1 but showing a still further preferred form of overvoltage-proof light-emitting diode according to the invention.

Embodiment of FIG. 13

The Schottky metal region 18 of the FIG. 1 device is replaceable by an n-type semiconductor thin film $40_a$ as in FIG. 13. The n-type semiconductor thin film $40_a$ as a semiconductor region of a second conductivity type is interposed between p-type semiconductor substrate 1 and bonding pad 20. The n-type semiconductor thin film $40_a$ may be formed by any such known method as vacuum deposition, chemical vapor deposition, sputtering, or printing, to a thickness of from one nanometer to one micrometer.

A material for the n-type semiconductor thin film $40_a$ may be selected from among amorphous silicon, a mixture (known to the specialists as ITO) of indium oxide ($In_2O_3$) and stannic oxide ($SnO_2$), ZnO, $SnO_2$, $In_2O_3$, zinc sulfide (ZnS), zinc selenide (ZnSe), zinc antimony oxide ($ZnSb_2O_6$), cadmium oxide (CdO), cadmium indium oxide ($CdIn_2O_4$), magnesium indium oxide ($MgIn_2O_4$), zinc gallium oxide ($ZnGa_2O_4$), cadmium gallium oxide ($CdGa_2O_4$), gallium oxide ($Ga_2O_3$), gallium indium oxide ($GaInO_3$), cadmium tin oxide ($CdSnO_4$), indium gallium magnesium oxide ($InGaMgO_4$), indium gallium zinc oxide ($InGaZnO_4$), zinc indium oxide ($Zn_2In_2O_5$), silver antimony oxide ($AgSbO_3$), cadmium antimony oxide ($Cd_2Sb_2O_7$), cadmium germanium oxide ($Cd_2GeO_4$), silver indium oxide ($AgInO_2$), cadmium sulfide (CdS), and cadmium selenide (CdSe).

Figure 6:
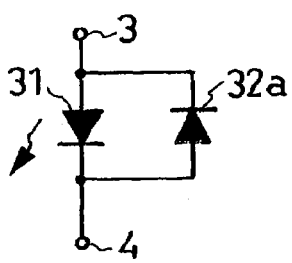
FIG. 6 is a schematic electrical diagram of the FIG. 5 device.

The n-type semiconductor thin film $40_a$ forms a pn junction with the p-type substrate 1, as does the n-type semiconductor region 40 of FIG. 5. Thus a protector diode similar to the pn-junction diode $32_a$, FIG. 6, is created by the protector region 7 of the substrate 1 and the n-type semiconductor thin film $40_a$. This embodiment offers the same advantages as do the embodiments of FIGS. 1 and 5.

Figure 14:
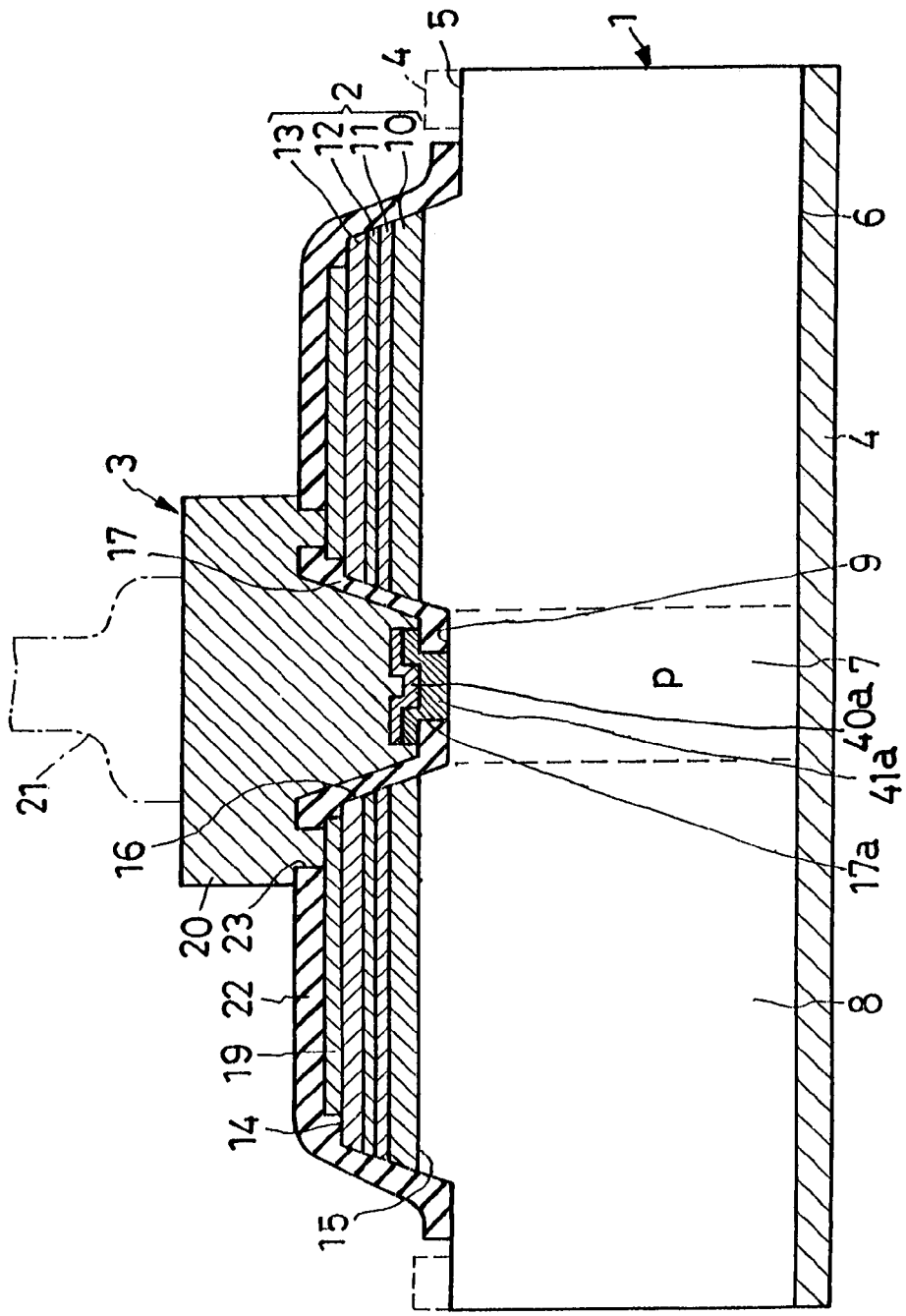
FIG. 14 is a view similar to FIG. 1 but showing a further preferred form of overvoltage-proof light-emitting diode according to the invention.

Embodiment of FIG. 14

The Schottky metal region 18 of the FIG. 1 device is also replaceable by a combination of p-type semiconductor thin film $41_a$ and n-type semiconductor thin film $40_a$ as in FIG. 14. The construction of this FIG. 14 device may be restated that the p-type semiconductor thin film $41_a$ as a semiconductor region of a first conductivity type is interposed between the p-type semiconductor substrate 1 and n-type semiconductor thin film $40_a$ of the FIG. 13 device.

The p-type semiconductor thin film $41_a$ may be formed by any such known method as vacuum deposition, chemical vapor deposition, sputtering, or printing, to a thickness of from one nanometer to one micrometer. Preferred materials for the p-type semiconductor thin film $41_a$ include p-type amorphous silicon, nickel oxide (NiO), red copper oxide ($Cu_2O$), ferrous oxide (FeO), copper aluminum oxide ($CuAlO_2$), copper gallium oxide ($CuGaO_2$), and strontium copper oxide ($SrCu_2O_2$).

A pn junction is formed by the n-type semiconductor region $40_a$ and p-type semiconductor region $41_a$. The p-type semiconductor thin film $41_a$ is in ohmic contact with the p-type semiconductor substrate 1, and the n-type semiconductor thin film $40_a$ is in ohmic contact with the bonding pad 20. Thus the n-type semiconductor thin film $40_a$ and p-type semiconductor thin film $41_a$ provide in combination an overvoltage protector similar to the pn-junction diode $32_a$, FIG. 6.

Figure 15:
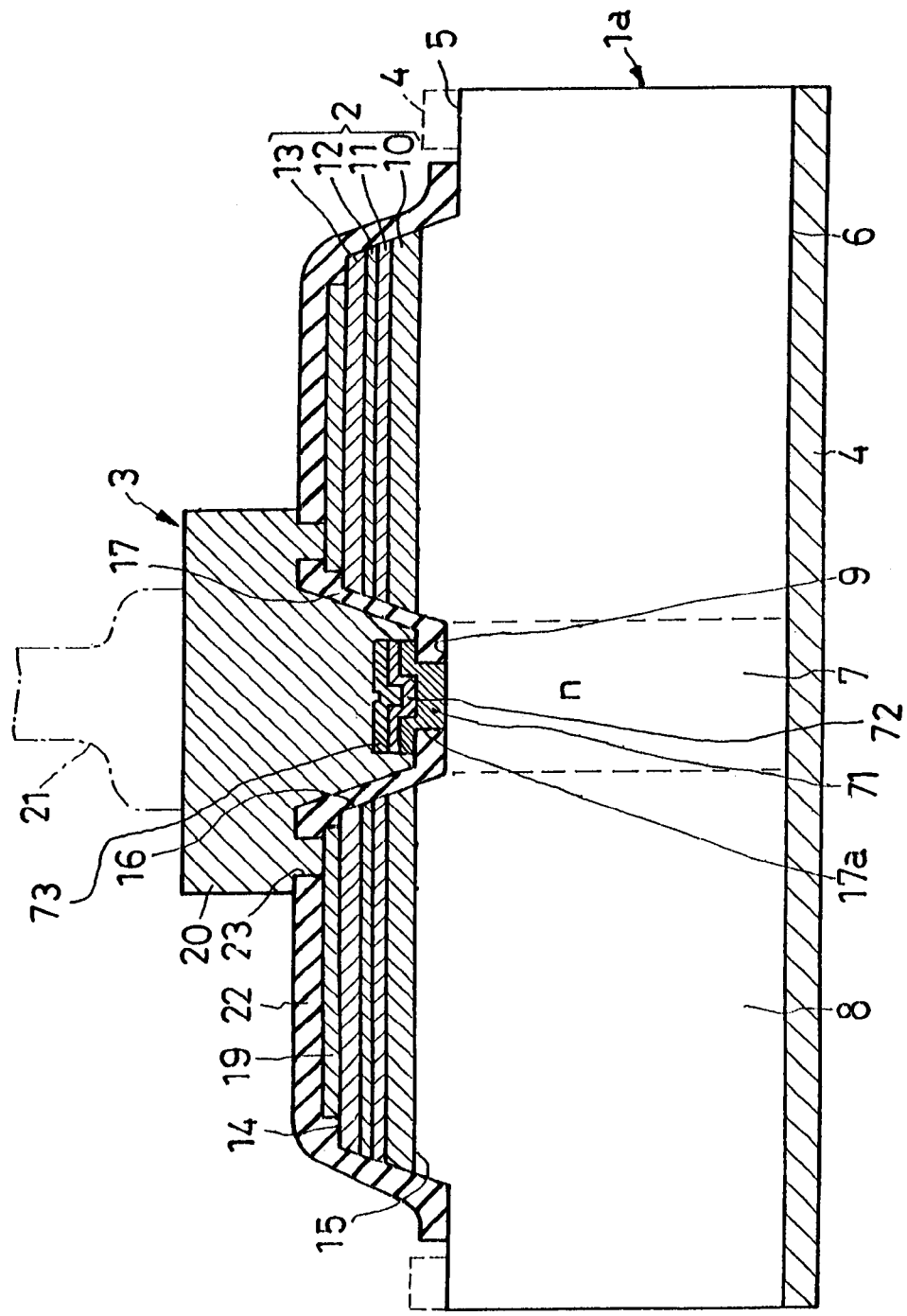
FIG. 15 is a view similar to FIG. 1 but showing a further preferred form of overvoltage-proof light-emitting diode according to the invention.

Embodiment of FIG. 15

The FIG. 15 device is similar to that of FIG. 1 except that an n-type semiconductor substrate $1_a$ is employed in place of the p-type substrate 1 of the FIG. 1 device, and a lamination of a first n-type semiconductor thin film 71 as a first semiconductor region of the first conductivity, p-type semiconductor thin film 72 as a second semiconductor region of the second conductivity and a second n-type semiconductor thin film 73 as a third semiconductor region of the first conductivity in place of the Schottky metal region 18 of the FIG. 1 device.

Placed in ohmic contact with the n-type semiconductor substrate $1_a$, the first n-type semiconductor thin film 71 is made from the same materials, and by the same methods, as is the n-type semiconductor thin film $40_a$ of FIGS. 13 and 15. Overlying this first n-type semiconductor thin film 73, the p-type semiconductor thin film 72 is made from the same materials, and by the same methods, as is the p-type semiconductor thin film $41_a$ of FIG. 14. The second n-type semiconductor thin film 73 overlies the p-type semiconductor thin film 72 and makes ohmic contact with the bonding pad 20. The combination of the first n-type semiconductor thin film 71, p-type semiconductor thin film 72, and second n-type semiconductor thin film 73 is functionally equivalent to the npn diode $32_b$ of FIG. 8.

Figure 16:
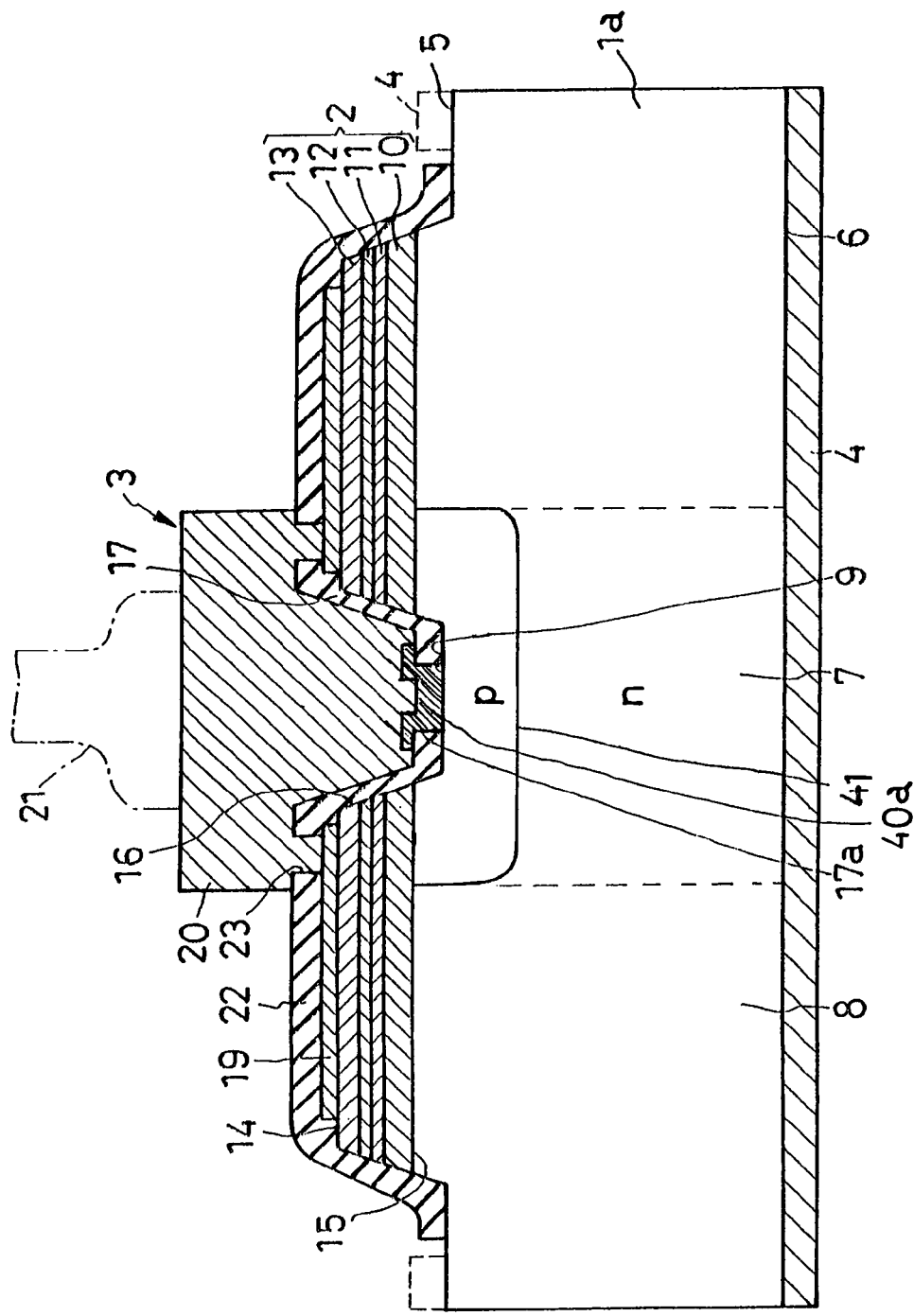
FIG. 16 is a view similar to FIG. 1 but showing a further preferred form of overvoltage-proof light-emitting diode according to the invention.

Embodiment of FIG. 16

The FIG. 16 device is akin to that of FIG. 7 except that the former does not have the n-type semiconductor region 40 of the latter but does have the n-type semiconductor thin film $40_a$ formed on the n-type semiconductor substrate $1_a$. The n-type semiconductor thin film $40_a$ is formed from the same materials, and by the same methods, as is that identified by the same reference characters in FIG. 13. This n-type semiconductor thin film $40_a$ forms a pn junction with the p-type semiconductor region 41 and makes ohmic contact with the bonding pad 20. Thus the combination of the n-type semiconductor substrate $1_a$, p-type semiconductor region 41, and n-type semiconductor thin film $40_a$ is functionally equivalent to the npn diode $32_b$ of FIG. 8.

Figure 17:
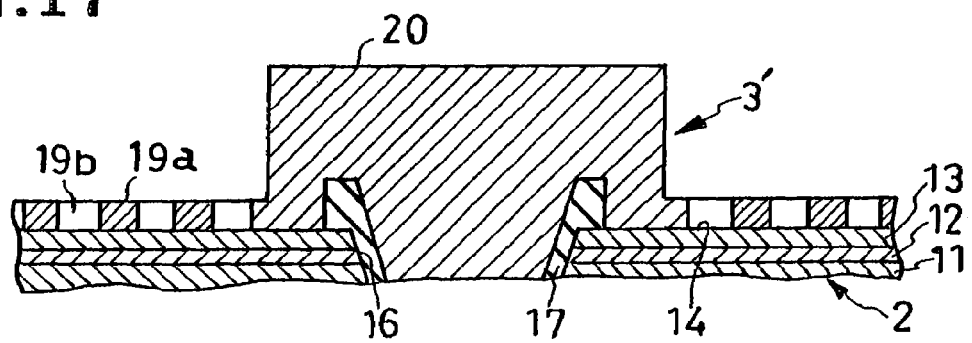
FIG. 17 is a fragmentary cross section through a yet further preferred form of overvoltage-proof light-emitting diode according to the invention.

Embodiment of FIG. 17

The overvoltage-proof LED shown fragmentarily in FIG. 17 employs an open-worked conductor layer $19_a$ in place of the transparent conductor film 19 of FIGS. 1, 5, 7, 9, 11 and 13–16 and is similar to the devices shown in these figures in all the other details construction. The conductor layer $19_a$ constitutes in combination with the bonding pad 20 the front electrode 3'. Meshed or striped, the conductor layer $19_a$ is electrically coupled to the bonding pad 20 and covers a part of the major surface 14 of the main semiconductor region 2 or of its p-type semiconductor layer 13, making ohmic contact therewith. The conductor layer $19_a$ has a plurality of holes 19b. Therefore, the light generated in the main semiconductor region 2 is emitted through the holes 19b of the conductor layer $19_a$. The bonding pad 20 is formed more thickly than the conductor layer $19_a$.

It will be observed from FIG. 17 that the bonding pad 20 has its bottom periphery placed in ohmic contact with the major surface 14 of the main semiconductor region 2. Current will therefore flow from front electrode 3 to main semiconductor region 2 even without the open-worked conductor layer $19_a$. In the absence of this conductor layer $19_a$ constituting a part of the front electrode 3', the bottom periphery of the bonding pad 20 will serve as the required part of the electrode or the first portion of the first electrode. Current may not flow uniformly through the main semiconductor region 2 without the open-worked conductor layer $19_a$, but then the light will be totally free from interference by this layer. The manufacturing cost of the LED will also become less as the open-worked conductor layer $19_a$ need not be fabricated. Whether or not the open-worked conductor layer $19_a$ should be included in the overvoltage-proof LED may therefore be determined in consideration of the efficiency of light production, manufacturing cost, and other factors.

It is now apparent that the teachings of FIG. 17 are applicable to all the foregoing devices of FIGS. 1, 5, 7, 9, 11 and 13–16. The resulting devices will still possess all the advantages set forth earlier in this specification.

Possible Modifications

Notwithstanding the foregoing detailed disclosure it is not desired that the present invention be limited by the exact showing of the drawings or the description thereof. The following is a brief list of possible modifications, alterations or adaptations of the illustrated embodiments which are all believed to fall within the purview of the invention:

1. The electrode 4 could be formed on the major surface 5, instead of on the other major surface 6, of the substrate 1 or $1_a$ in the embodiments of FIGS. 5, 7, 9, 11 and 13–16 as well.

2. The substrate 1 need not necessarily be of monocrystalline silicon but may, for example, be of polycrystalline silicon, silicon carbide or other silicon compounds, or Group III–V compounds. Even a metal-made substrate could be employed in the FIGS. 9, 11, 14 and 15 embodiments.

3. The conductivity types of the substrate 1 or $1_a$ and the constituent layers of the main semiconductor region 2 are all reversible.

4. The main semiconductor region 2 could be additionally provided with a known current spreading layer or contact layer.

5. Both the overvoltage protector of the FIGS. 1, 5 and 7 embodiments and the overvoltage protector of the FIGS. 9, 11, 14 and 15 embodiments may be incorporated in one and the same overvoltage-proof LED.

6. The ceramic protector varistor 60 of the FIG. 11 embodiment is replaceable by other chip protectors such as the silicon varistor, constant-voltage diode or voltage-regulating diode, rectifying diode, and three-layer diode.

7. Conductors other than wire could be coupled to the bonding pad.

8. The main semiconductor region 2 need not necessarily be grown in vapor phase on the substrate 1 or $1_a$ but may be bonded thereto or to a metal-made baseplate under heat and pressure.

9. A reflector may be employed for redirecting the light that is directed toward the substrate 1 or $1_a$, back ward the major surface 14 of the main semiconductor region 2.

What is claimed is:

1. An overvoltage-proof light-emitting semiconductor device comprising:
   (a) a substrate of substantially electrically conducting material having a first and a second opposite major surface;
   (b) a main semiconductor region formed on the first major surface of the substrate and comprising a plurality of semiconductor layers for generating light, the main semiconductor region having a first major surface from which the light is emitted, a second major surface held against the first major surface of the substrate, and a hole extending therethrough between the first and second major surfaces thereof;
   (c) a first electrode covering a part of the first major surface of the main semiconductor region and the hole of the main semiconductor region, the first electrode being electrically connected to the first major surface of the main semiconductor region and having a function of a bonding pad;
   (d) a second electrode formed on the substrate; and
   (e) an overvoltage protector disposed between the first electrode and the second major surface of the substrate and electrically connected to both of the first and the second electrode.

2. An overvoltage-proof light-emitting semiconductor device as defined in claim 1, wherein the substrate is of a semiconductor and has a protector region extending between the first and the second opposite major surface thereof, and wherein the overvoltage protector is a Schottky barrier diode comprising a metal region disposed between the first electrode and the first major surface of the substrate and in Schottky contact with the protector region of the semiconductor substrate, the metal region being electrically connected to the first electrode.

3. An overvoltage-proof light-emitting semiconductor device as defined in claim 1, wherein the substrate is of a semiconductor, and wherein the overvoltage protector is a pn-junction diode comprising:
   (a) a first semiconductor region of a first conductivity type formed in the semiconductor substrate; and
   (b) a second semiconductor region of a second conductivity type formed in the first semiconductor region and having a surface exposed at the first major surface of the semiconductor substrate, the second semiconductor region being at least in part disposed between the first electrode and the second major surface of the semiconductor substrate, the first electrode being in ohmic contact with the second semiconductor region.

4. An overvoltage-proof light-emitting semiconductor device as defined in claim 1, wherein the substrate is of a semiconductor, and wherein the overvoltage protector is a three-layer diode comprising:
   (a) a first semiconductor region of a first conductivity type formed in the semiconductor substrate;
   (b) a second semiconductor region of a second conductivity type formed in the first semiconductor region and having a surface exposed at the first major surface of the semiconductor substrate; and
   (c) a third semiconductor region of the first conductivity type formed in the second semiconductor region and having a surface exposed at the first major surface of the semiconductor substrate, the third semiconductor region being at least in part disposed between the first electrode and the second major surface of the semiconductor substrate, the first electrode being in ohmic contact with the third semiconductor region.

5. An overvoltage-proof light-emitting semiconductor device as defined in claim 1, wherein the overvoltage protector is disposed between the first electrode and the first major surface of the substrate.

6. An overvoltage-proof light-emitting semiconductor device as defined in claim 5, wherein the overvoltage protector is a varistor comprising a semiconductor region which is in contact with the substrate on one hand and with the first electrode on the other hand.

7. An overvoltage-proof light-emitting semiconductor device as defined in claim 6, wherein the varistor further comprises at least one varistor electrode in contact with the semiconductor region.

8. An overvoltage-proof light-emitting semiconductor device as defined in claim 5, wherein the overvoltage protector is a device capable of functioning as both varistor and capacitor.

9. An overvoltage-proof light-emitting semiconductor device as defined in claim 1, wherein the overvoltage protector is a capacitor comprising a dielectric region which is in contact with the substrate on one hand and with the first electrode on the other hand.

10. An overvoltage-proof light-emitting semiconductor device as defined in claim 9, wherein the capacitor further comprises at least one capacitor electrode in contact with the dielectric region.

11. An overvoltage-proof light-emitting semiconductor device as defined in claim 1, wherein the substrate is of a semiconductor of a first conductivity type, and wherein the overvoltage protector comprises a semiconductor region of a second conductivity type disposed between the first electrode and the semiconductor substrate.

12. An overvoltage-proof light-emitting semiconductor device as defined in claim 1, wherein the substrate is of a semiconductor of a first conductivity type, and wherein the overvoltage protector comprises:
    (a) a first semiconductor region of the first conductivity type disposed between the semiconductor substrate and the first electrode; and
    (b) a second semiconductor region of a second conductivity type disposed between the first semiconductor region and the first electrode.

13. An overvoltage-proof light-emitting semiconductor device as defined in claim 1, wherein the substrate is of a semiconductor of a first conductivity type, and wherein the overvoltage protector comprises:
    (a) a first semiconductor region of the first conductivity type disposed between the semiconductor substrate and the first electrode;
    (b) a second semiconductor region of a second conductivity type disposed between the first semiconductor region and the first electrode; and
    (c) a third semiconductor region of the first conductivity type disposed between the second semiconductor region and the first electrode.

14. An overvoltage-proof light-emitting semiconductor device as defined in claim 1, wherein the substrate is of a semiconductor of a first conductivity type, and wherein the overvoltage protector comprises:
    (a) a first semiconductor region of a second conductivity type formed in the semiconductor substrate so as to be exposed at the first major surface thereof; and
    (b) a second semiconductor region of the first conductivity type disposed between the first semiconductor region and the first electrode.

15. An overvoltage-proof light-emitting semiconductor device as defined in claim 1 further comprising a film of electrically insulating material that covers the surfaces defining the hole in the main semiconductor region.

16. An overvoltage-proof light-emitting semiconductor device as defined in claim 1, wherein the main semiconductor region has a hole extending therethrough between the first and the second major surface thereof, and wherein the overvoltage protector is at least partly received in the hole in the main semiconductor region.

17. An overvoltage-proof light-emitting semiconductor device as defined in claim 1, is further comprising a transparent film of electrically conducting material formed on the first major surface of the main semiconductor region and connected to the first electrode.

18. An overvoltage-proof light-emitting semiconductor device as defined in claim 1, wherein the first electrode is connected to the first major surface of the main semiconductor region.

19. An overvoltage-proof light-emitting semiconductor device as defined in claim 1, further comprising an open-worked layer of electrically conducting material formed on the first major surface of the main semiconductor region and connected to the first electrode.

20. An overvoltage-proof light-emitting semiconductor device as defined in claim 1, wherein, as seen from a top view of the device, the overvoltage protector substantially wholly lies inwardly of the first electrode.

21. An overvoltage-proof light-emitting semiconductor device as defined in claim 1, wherein the substrate is of silicon or a silicon compound, and wherein the constituent semiconductor layers of the main semiconductor region are made from Group III–V compound semiconductors.

* * * * *